United States Patent
Wu et al.

(10) Patent No.: US 9,653,352 B2
(45) Date of Patent: May 16, 2017

(54) METHODS FOR FORMING METAL ORGANIC TUNGSTEN FOR MIDDLE OF THE LINE (MOL) APPLICATIONS

(71) Applicant: APPLIED MATERIALS, INC., Santa Clara, CA (US)

(72) Inventors: Liqi Wu, Santa Clara, CA (US); Sang Ho Yu, Cupertino, CA (US); Kazuya Daito, Milpitas, CA (US); Kie Jin Park, San Jose, CA (US); Kai Wu, Palo Alto, CA (US); David Thompson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/300,773

(22) Filed: Jun. 10, 2014

(65) Prior Publication Data

US 2015/0294906 A1 Oct. 15, 2015

Related U.S. Application Data

(60) Provisional application No. 61/978,540, filed on Apr. 11, 2014.

(51) Int. Cl.
*H01L 21/768* (2006.01)
*H01L 21/285* (2006.01)
(Continued)

(52) U.S. Cl.
CPC ...... *H01L 21/76877* (2013.01); *C23C 16/045* (2013.01); *C23C 16/06* (2013.01);
(Continued)

(58) Field of Classification Search
CPC ........... H01L 21/6877; H01L 21/76843; H01L 21/76876; H01L 21/28556; C23C 16/45536; C23C 16/045; C23C 16/06
(Continued)

(56) References Cited

U.S. PATENT DOCUMENTS 5,897,369 A * 4/1999 Jun ................... H01L 21/76831
257/E21.584
6,383,821 B1 * 5/2002 Young et al. ................. 438/6
(Continued)

FOREIGN PATENT DOCUMENTS

| EP | 1 094 504 A2 | | 4/2001 | |
|---|---|---|---|---|
| WO | WO 2013/046155 | * | 4/2013 | ............. C07F 11/00 |
| WO | WO 2013046155 | * | 4/2013 | ............. C07F 11/00 |

OTHER PUBLICATIONS

J. Kelsey et al., Low temperature metal-organic chemical vapor deposition of tungsten nitride as diffusion barrier for copper metallization, May/Jun. 1999, American Vaccum Society, J. Vac. Tech. B vol. 17, No. 3, pp. 1101-1104.*

(Continued)

*Primary Examiner* — Victoria K Hall
(74) *Attorney, Agent, or Firm* — Moser Taboada; Alan Taboada

(57) ABSTRACT

Methods for forming metal organic tungsten for middle-of-the-line (MOL) applications are provided herein. In some embodiments, a method of processing a substrate includes providing a substrate to a process chamber, wherein the substrate includes a feature formed in a first surface of a dielectric layer of the substrate; exposing the substrate to a plasma formed from a first gas comprising a metal organic tungsten precursor to form a tungsten barrier layer atop the dielectric layer and within the feature, wherein a temperature of the process chamber during formation of the tungsten barrier layer is less than about 225 degrees Celsius; and depositing a tungsten fill layer over the tungsten barrier layer to fill the feature to the first surface.

20 Claims, 3 Drawing Sheets

(51) Int. Cl.
*C23C 16/04* (2006.01)
*C23C 16/06* (2006.01)
*C23C 16/455* (2006.01)

(52) U.S. Cl.
CPC .. *C23C 16/45536* (2013.01); *H01L 21/28556* (2013.01); *H01L 21/76843* (2013.01); *H01L 21/76876* (2013.01)

(58) Field of Classification Search
USPC ........ 257/770, 773–775; 438/637–640, 643, 438/644, 648, 685
See application file for complete search history.

(56) References Cited

U.S. PATENT DOCUMENTS

| | | | | |
|---|---|---|---|---|
| 6,458,251 | B1* | 10/2002 | Sundarrajan | C23C 14/046 204/192.12 |
| 7,844,705 | B2* | 11/2010 | Jones | G06F 15/16 382/128 |
| 9,070,749 | B2* | 6/2015 | Kang | H01L 21/76841 |
| 9,169,556 | B2* | 10/2015 | Wu | C23C 16/452 |
| 9,230,815 | B2* | 1/2016 | Fu | H01L 21/28506 |
| 9,601,339 | B2* | 3/2017 | Fu | H01L 21/28562 |
| 2002/0192953 | A1* | 12/2002 | Wang | H01L 21/28562 438/672 |
| 2003/0008070 | A1 | 1/2003 | Seutter et al. | |
| 2003/0017696 | A1* | 1/2003 | Yen | H01L 21/76843 438/672 |
| 2003/0134504 | A1* | 7/2003 | Denning | H01L 21/76802 438/637 |
| 2003/0203616 | A1* | 10/2003 | Chung | C23C 16/16 438/627 |
| 2004/0121596 | A1* | 6/2004 | Pan et al. | 438/680 |
| 2004/0150108 | A1* | 8/2004 | Buerke | H01L 21/76843 257/751 |
| 2005/0095846 | A1* | 5/2005 | Basol | H01L 21/76843 438/637 |
| 2005/0124154 | A1* | 6/2005 | Park | H01L 21/28562 438/643 |
| 2006/0046468 | A1* | 3/2006 | Akram | H01L 21/76898 438/637 |
| 2007/0066060 | A1* | 3/2007 | Wang | C23C 16/34 438/685 |
| 2009/0014879 | A1* | 1/2009 | Park | H01L 21/28562 257/751 |
| 2009/0026618 | A1* | 1/2009 | Kim | H01L 21/76843 257/751 |
| 2009/0053893 | A1* | 2/2009 | Khandelwal et al. | 438/680 |
| 2009/0081866 | A1* | 3/2009 | Lee et al. | 438/655 |
| 2011/0159690 | A1 | 6/2011 | Chandrashekar et al. | |
| 2011/0221044 | A1 | 9/2011 | Danek et al. | |
| 2011/0233778 | A1* | 9/2011 | Lee | C23C 16/34 257/751 |
| 2012/0045893 | A1* | 2/2012 | Koerner | H01L 21/28512 438/643 |
| 2012/0231626 | A1* | 9/2012 | Lee et al. | 438/653 |
| 2013/0005140 | A1 | 1/2013 | Jeng et al. | |
| 2014/0030889 | A1 | 1/2014 | Chen et al. | |

OTHER PUBLICATIONS

O. Bchir et al., Tungsten Allylimido Complexes Cl4(RCN)W(NC3H5) as Single-Source CVD Precursors for WNxCy Thin Films, May 6, 2005, American Chemical Society, J. Am. Chem. Soc. vol. 127, pp. 7825-7833.*
International Search Report and Written Opinion mailed Jun. 24, 2015 for PCT Application No. PCT/US2015/020502.

* cited by examiner

METHODS FOR FORMING METAL ORGANIC TUNGSTEN FOR MIDDLE OF THE LINE (MOL) APPLICATIONS

CROSS-REFERENCE TO RELATED APPLICATIONS

This application claims benefit of U.S. provisional patent application No. 61/978,540, filed Apr. 11, 2014, which is herein incorporated by reference.

FIELD

Embodiments of the present disclosure generally relate to methods of processing substrates.

BACKGROUND

Traditional middle-of-the-line (MOL) fabrication uses a stack having titanium (Ti)/titanium nitride (TiN), a tungsten nucleation layer, and a tungsten fill layer. TiN is used as a fluorine barrier layer. The tungsten nucleation layer is formed atop the TiN layer by, for example chemical vapor deposition using diborane ($B_2H_6$) and tungsten hexafluoride ($WF_6$). Both the TiN barrier layer and the tungsten nucleation layer are highly resistive compared to the tungsten fill layer. The minimum TiN barrier layer thickness is at least about 20 angstroms. The tungsten nucleation layer typically has a thickness of about 10 to about 30 angstroms. As the geometries of electronic devices continue to shrink and the density of devices continue to increase, overall feature size has decreased and aspect ratio has increased. The inventors have observed that as feature sizes shrink to about 10 nm or less, the TiN barrier layer and tungsten nucleation layer occupy a significant amount the via space, leaving little room for low resistive tungsten growth. Furthermore, non-conformal deposition of the TiN barrier layer and tungsten nucleation layer narrows via openings, causing significant challenge for subsequent tungsten fill steps. Therefore, the inventors believe that MOL fabrication requires new processes and integration schemes to meet its resistivity and fill requirements.

Thus, the inventors have provided improved methods for forming metal organic tungsten for MOL applications.

SUMMARY

Methods for forming metal organic tungsten for middle-of-the-line (MOL) applications are provided herein. In some embodiments, a method of processing a substrate includes providing a substrate to a process chamber, wherein the substrate includes a feature formed in a first surface of a dielectric layer of the substrate; exposing the substrate to a plasma formed from a first gas comprising a metal organic tungsten precursor to form a tungsten barrier layer atop the dielectric layer and within the feature, wherein a temperature of the process chamber during formation of the tungsten barrier layer is less than about 200 degrees Celsius; and depositing a tungsten fill layer over the tungsten barrier layer to fill the feature to the first surface.

In some embodiments, a method of processing a substrate includes providing a substrate to a process chamber, wherein the substrate includes a feature formed in a first surface of a dielectric layer of the substrate; depositing a tungsten seed layer atop the substrate and within the feature; depositing a tungsten barrier layer atop the tungsten seed layer by exposing the substrate to a plasma formed from a first gas comprising a metal organic tungsten precursor, wherein a temperature of the process chamber during formation of the tungsten barrier layer is less than about 225 degrees Celsius; and depositing a tungsten fill layer over the tungsten barrier layer to fill the feature to the first surface.

In some embodiments, a computer readable medium is provided having instructions stored thereon that, when executed, causes a process chamber to perform a method for processing a substrate. The method may include any of the methods disclosed herein Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
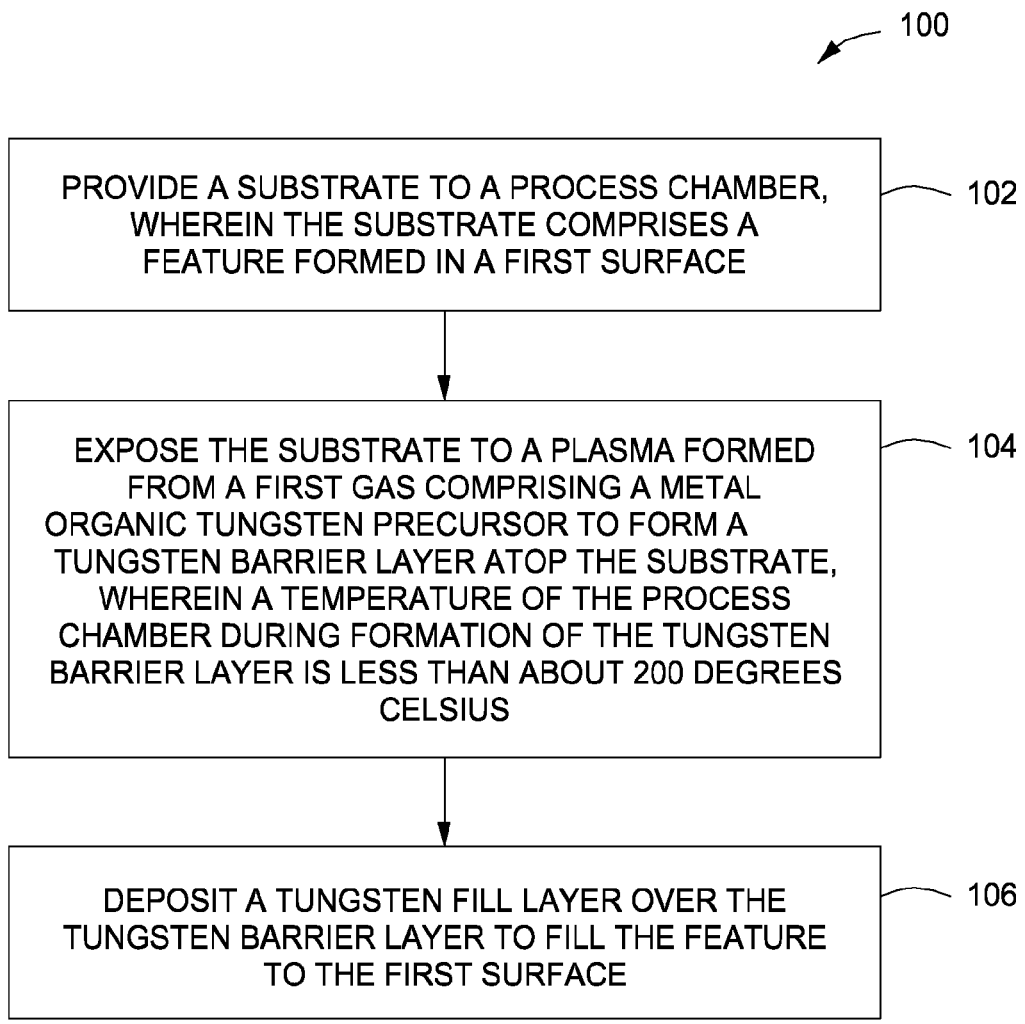
FIG. 1 depicts a flow chart of a method for processing a substrate in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for forming metal organic tungsten barrier layers for middle-of-the-line (MOL) applications are provided herein. The inventive methods described herein may advantageously be used to facilitate formation of improved metal contacts, vias, and gates by replacing traditional titanium nitride barrier layers and tungsten nucleation layers with a tungsten barrier layer. The tungsten barrier layers occupy less space within a feature than traditional titanium nitride and tungsten nucleation layers, thereby providing space for low resistivity tungsten fill material. In addition, the tungsten barrier layer reduces resistance and facilities the tungsten fill process as compared to the conventional traditional titanium nitride barrier layer.

The inventive methods described herein may be utilized with any device nodes, but may be particularly advantageous in device nodes of about 10 nm or less. A "barrier layer," as used herein, may refer to a layer conformably formed along at least a portion of the sidewalls and/or lower surface of a feature such that a substantial portion of the feature prior to the deposition of the layer remains unfilled after deposition of the layer. In some embodiments, the barrier layer may be formed along the entirety of the sidewalls and lower surface of the feature.

FIG. 1 depicts a flow chart of a method 100 for forming a metal organic tungsten layer for MOL applications in accordance with some embodiments of the present disclosure. The method 100 may be performed in any suitable process chambers configured for one or more of chemical vapor deposition (CVD) or plasma enhanced atomic layer deposition (PEALD). Exemplary processing systems that may be used to perform the inventive methods disclosed herein may include, but are not limited to, those of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including those from other manufacturers, may also be suitably used in connection with the teachings provided herein.

Figure 2A:
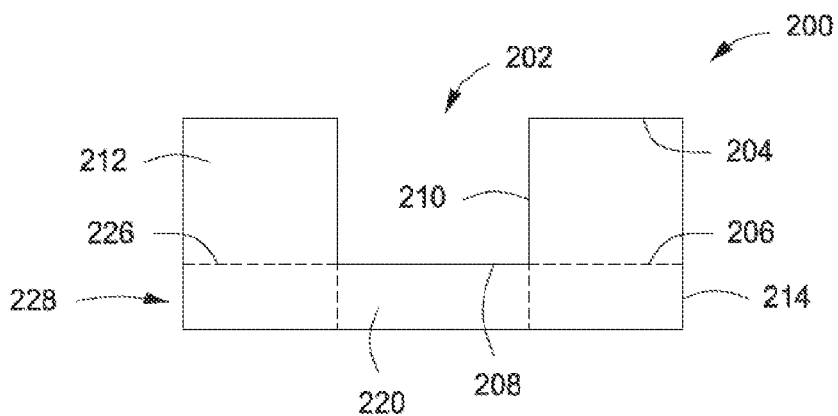
FIGS. 2A-2C depict a side cross-sectional view of an interconnect structure formed in a substrate in accordance with some embodiments of the present disclosure.

The method 100 generally begins at 102 by providing a substrate 200, as depicted in FIG. 2A, having a feature 202 formed in a first surface 204 of the substrate 200 and extending into the substrate 200 towards an opposing second surface 206 of the substrate 200. The substrate 200 may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate, such that the tungsten barrier layer, as described below, may be at least partially formed thereon. For example, in some embodiments, a layer comprising a metal, a nitride, an oxide, or the like, or combinations thereof may be disposed on the substrate and may have the tungsten layer formed upon such layer or layers.

The substrate 200 may be any suitable substrate having a feature 202 formed therein. For example, the substrate 200 may comprise one or more of a dielectric material, silicon (Si), metals, or the like. In addition, the substrate 200 may include additional layers of materials or may have one or more completed or partially completed structures formed therein or thereon. For example, the substrate 200 may include a first dielectric layer 212, such as silicon oxide, a low-k material (e.g., a material having a dielectric constant less than silicon oxide, or less than about 3.9), or the like. The feature 202 may be formed in the first dielectric layer 212. In some embodiments, the first dielectric layer 212 may be disposed atop a second dielectric layer 214, such as silicon oxide, silicon nitride, silicon carbide, or the like. A conductive material (e.g., conductive material 220) may be disposed in the second dielectric layer 214 and may be aligned with the feature 202 such that the feature 202, when filled with a conductive material, provides an electrical path to and from the conductive material. For example, the conductive material may be part of a line or via to which the interconnect is coupled.

The feature 202 may be any opening, such as a via, trench, dual damascene structure, or the like. In some embodiments, the feature 202 may have a high aspect ratio, e.g., an aspect ratio of about 5:1 or more. As used herein, the aspect ratio is the ratio of a depth of the feature to a width of the feature. The feature 202 may be formed by etching the substrate 200 using any suitable etch process. The feature 202 includes a bottom surface 208 and sidewalls 210.

Figure 2B:
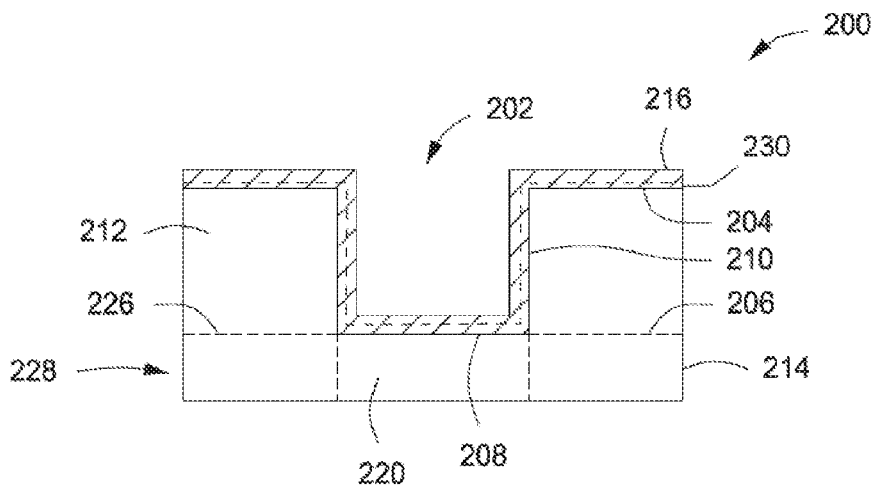
Figure 2C:
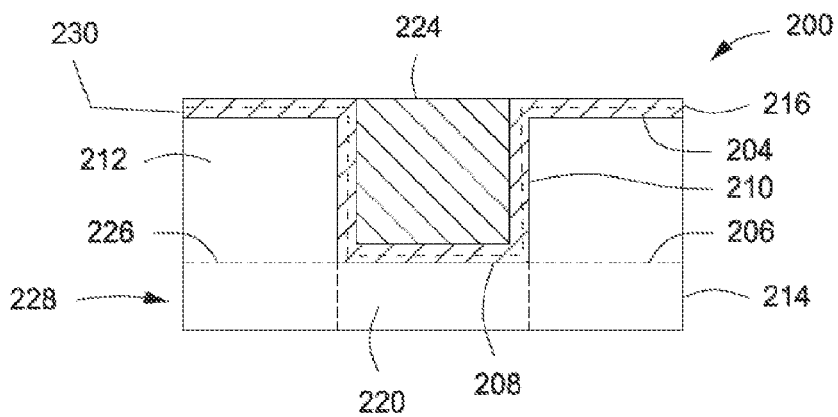

In some embodiments, and as illustrated by dotted lines in FIGS. 2A-2C, the feature 202 may extend completely through the substrate 200 and an upper surface 226 of a second substrate 228 and may form the bottom surface 208 of the feature 202. The second substrate 228 may be disposed adjacent to the second surface 206 of the substrate 200. Further (and also illustrated by dotted lines), a conductive material (e.g., conductive material 220), for example as part of a device, such as a logic device or the like, or an electrical path to a device requiring electrical connectivity, such as a gate, a contact pad, a conductive line or via, or the like, may be disposed in the upper surface 226 of the second substrate 228 and aligned with the feature 202.

Next at 104, and as depicted in FIG. 2B, the substrate 200 is exposed to a plasma formed from a first gas comprising a metal organic tungsten precursor to form a tungsten barrier layer 216 atop the substrate 200. For example, the sidewalls 210 of the feature 202, the bottom surface 208 of the feature 202, and the first surface 204 of the substrate 200 may be covered by the tungsten barrier layer 216. The first gas further comprises a reactant gas, such as hydrogen ($H_2$) or ammonia ($NH_3$), and a carrier gas, such as argon, helium, or nitrogen, along with the metal organic tungsten precursor gas. The presence of hydrogen in the first gas advantageously minimizes the presence of carbon impurities in the tungsten barrier layer 216. The carrier gas is provided at a flow rate of about 300 sccm to about 600 sccm.

The tungsten barrier layer 216 may serve to prevent diffusion of a subsequently deposited metal layer into underlying layers, such as first dielectric layer 212 and serves as a suitable surface for a subsequent formation of the tungsten fill layer described below. The presence of the tungsten barrier layer 216 advantageously eliminates the need for typical barrier layers formed from, for example titanium nitride, which also requires a tungsten nucleation layer to create a suitable surface for a subsequent formation of the tungsten fill layer. The tungsten barrier layer 216 also provides about 2-3 times lower resistivity as compared to a TiN barrier layer, thereby reducing via resistance. The tungsten barrier layer 216 may have any thickness suitable to prevent the diffusion of subsequently deposited materials into the underlying layers. For example, in some embodiments, the tungsten barrier layer 216 may have a thickness of about 15 to about 40 angstroms.

In some embodiments, suitable tungsten precursors may include precursors having the chemical formula $W(A)(B)_2(C)$, or $W(A)(B)_3(D)$, or $W(B)_6$, or $W(A)_2(D)_2$, or $W(B)_{6-x}(B2)_x$, or $W(E)_4$, or $W(F)_3$, or $W(F)_2(B)_2$, or $W(F)(B)_4$, where A is a negatively charged 6 electron donor, B is a neutral 2 electron donor, C is a positively charged 2 electron donor, D is a negatively charged 2 electron donor, E is a negatively charged 4 electron donor, F is a neutral 4 electron donor, and x is a positive integer from 0 to 6. Examples of suitable precursors include $W(CO)_6$, $CpW(CO)_2NO$, $EtCpW(CO)_2NO$, $Cp*W(CO)_3NO$, $Cp_2WH_2$, $C_4H_9CNW(CO)_5$, $(C_5H_{11}CN)W(CO)_5$, $W(C_3H_5)_4$, $W(C_3H_4CH_3)_4$, $W(C_4H_6)_3$, $W(C_4H_6)_2(CO)_2$, or $W(C_4H_6)(CO)_4$.

As described above, the tungsten barrier layer 216 is formed via a plasma enhanced atomic layer deposition process (PEALD) by exposing the substrate 200 to the tungsten precursor in a plasma state. The plasma may be formed by coupling sufficient energy, for example radio frequency (RF) energy from a power source to ignite the first gas to form the plasma. In some embodiments, the power source may illustratively provide about 100 W to about 1.2 kW, of power at a suitable frequency, such as about 13.56 MHz. The plasma facilitates a decomposition of the precursors, causing a deposition of material on the substrate 200, thereby forming the tungsten barrier layer 216.

General processing conditions for forming the tungsten barrier layer 216 discussed above includes maintaining process chamber pressure at about 5 to about 20 Torr. Furthermore, the temperature of the process chamber during formation of the tungsten barrier layer is less than about 225 degrees Celsius, such as about 175 to about 225 degrees Celsius. Unlike a thermal chemical vapor deposition process, where the temperature of the chamber must be greater than about 250 degrees Celsius in order to decompose the tungsten precursor materials, the inventors have observed that a PEALD process may be used to deposit a tungsten barrier layer at a temperature of less than about 225 degrees Celsius. The inventors have observed that this low temperature PEALD process advantageously forms a tungsten barrier layer having desired properties such as high density, low resistivity, and good step coverage, for example in a trench, via or other high aspect ratio feature. As used herein, step coverage is defined as the ratio of minimum thickness of material deposited on a sidewall of the structure to the thickness of material deposited on the field (e.g., upper surface of the substrate).

In some embodiments, a tungsten seed layer 230 is deposited atop the substrate 200 prior to formation of the tungsten barrier layer 216. The tungsten seed layer 230 is of a sufficient thickness to facilitate tungsten plasma enhanced atomic layer deposition (PEALD) growth on a underlying silicon or oxide surface. In some embodiments, the seed layer 230 may have a thickness of less than about 2 monolayers of tungsten. The tungsten seed layer 230 may be formed by a plasma enhanced chemical vapor deposition process using the tungsten precursors listed above. The inventors have observed that providing the tungsten seed layer 230 prior to the PEALD tungsten barrier layer formation provides a significant improvement of PEALD tungsten film properties, such as lower roughness (e.g., a reduction from about 5.9 angstroms to about 3.7 angstroms Rms) and lower resistivity (e.g., a reduction from about 304 $\mu\Omega$-cm to about 3.7 $\mu\Omega$-cm).

Next, at 106, and as depicted in FIG. 2C, a tungsten fill layer 224 is deposited over the tungsten barrier layer 216 to fill the feature 202. In some embodiments, the tungsten fill layer 224 may be deposited by a chemical vapor deposition process using for example $WF_6$ or a combination of $WF_6$ and a hydrogen gas such as $H_2$ or $NH_3$.

The feature 202 may be filled above the level of the upper surface of the substrate 200 and the deposited material (e.g., tungsten barrier layer 216) and the tungsten fill layer 224 may remain on the upper surface of the substrate 200. Accordingly, techniques, such as wet clean in an acidic solution, chemical or electrochemical mechanical polishing, or the like may be used to remove excess deposited material from the upper surface, such that the feature 202 is filled with the deposited conductive material up to about an equivalent level with the upper surface of the substrate, as depicted in FIG. 2C.

Figure 3:
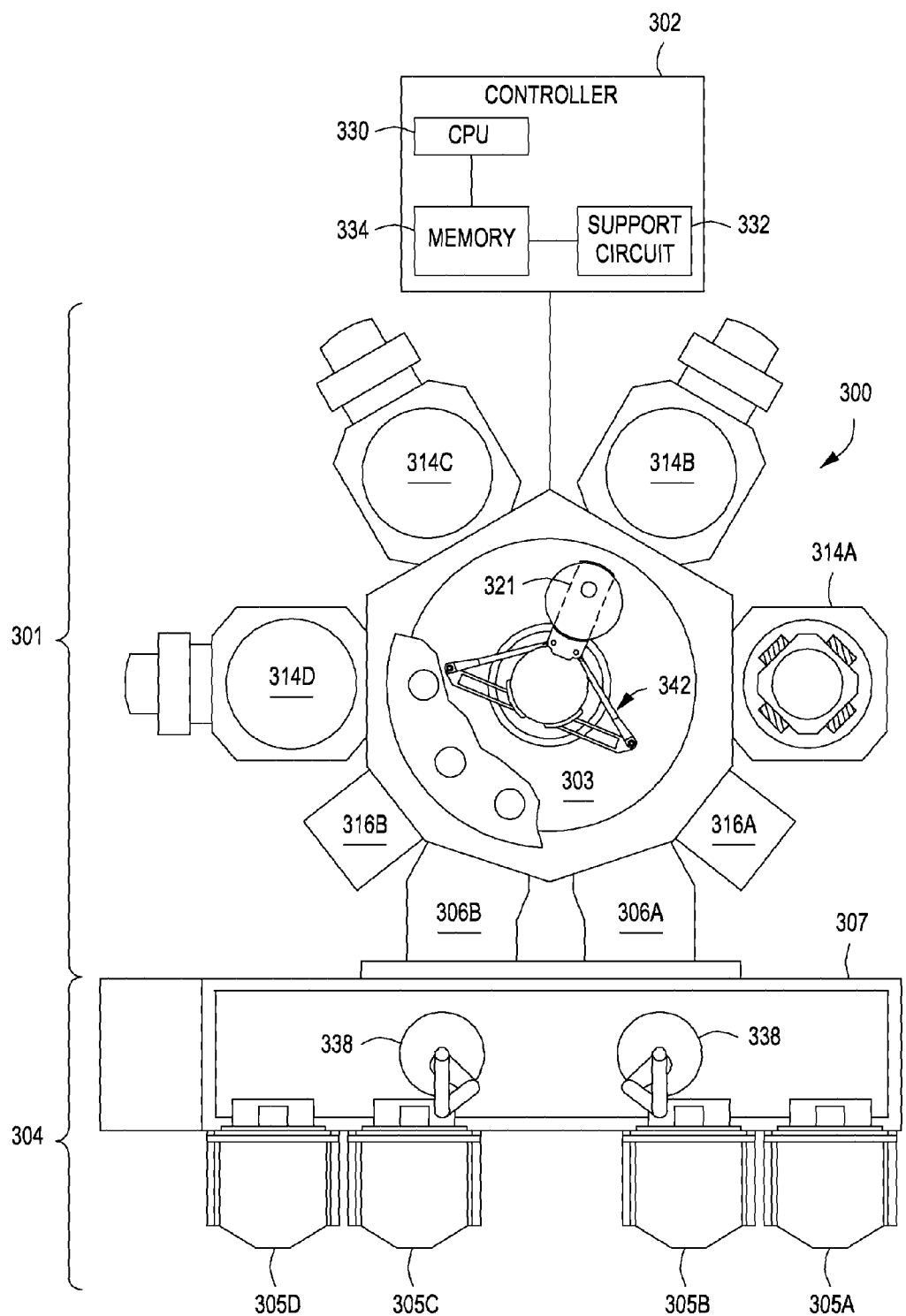
FIG. 3 depicts a cluster tool suitable to perform methods for processing a substrate in accordance with some embodiments of the present disclosure.

The methods described herein may be performed in individual process chambers that may be provided in a standalone configuration or as part of a cluster tool, for example, an integrated tool 300 (i.e., cluster tool) described below with respect to FIG. 3. Examples of the integrated tool 300 include the CENTURA® and ENDURA® integrated tools, available from Applied Materials, Inc., of Santa Clara, Calif. It is contemplated that the methods described herein may be practiced using other cluster tools having suitable process chambers coupled thereto, or in other suitable process chambers. For example, it may be advantageous in some embodiments, to perform the inventive methods discussed above in an integrated tool such that there are limited or no vacuum breaks between processing steps. For example, reduced vacuum breaks may limit or prevent contamination of the seed layer or other portions of the substrate.

The integrated tool 300 includes a vacuum-tight processing platform 301, a factory interface 304, and a system controller 302. The processing platform 301 comprises multiple processing chambers, such as 314A, 314B, 314C, and 314D operatively coupled to a vacuum substrate transfer chamber (transfer chamber 303). The factory interface 304 is operatively coupled to the transfer chamber 303 by one or more load lock chambers (two load lock chambers, such as 306A and 306B shown in FIG. 4).

In some embodiments, the factory interface 304 comprises at least one docking station 307, at least one factory interface robot 338 to facilitate the transfer of the semiconductor substrates. The docking station 307 is configured to accept one or more front opening unified pod (FOUP). Four FOUPS, such as 305A, 305B, 305C, and 305D are shown in the embodiment of FIG. 3. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303. The load lock chamber 306A and 306B are coupled to a pressure control system (not shown) which pumps down and vents the load lock chambers 306A and 306B to facilitate passing the substrates between the vacuum environment of the transfer chamber 303 and the substantially ambient (e.g., atmospheric) environment of the factory interface 304. The transfer chamber 303 has a vacuum robot 342 disposed therein. The vacuum robot 342 is capable of transferring substrates 321 between the load lock chamber 306A and 306B and the processing chambers 314A, 314B, 314C, and 314D.

In some embodiments, the processing chambers 314A, 314B, 314C, and 314D, are coupled to the transfer chamber 303. The processing chambers 314A, 314B, 314C, and 314D comprise at least a plasma enhanced atomic layer deposition (PEALD) chamber, and a chemical vapor deposition (CVD) chamber. Additional chambers may also be provided such as additional CVD chambers and/or annealing chambers, a physical vapor deposition (PVD) chamber, or the like. CVD and annealing chambers may include any of those suitable to perform all or portions of the methods described herein, as discusses above.

In some embodiments, one or more optional service chambers (shown as 316A and 316B) may be coupled to the transfer chamber 303. The service chambers 316A and 316B may be configured to perform other substrate processes, such as degassing, orientation, substrate metrology, cool down and the like.

The system controller 302 controls the operation of the tool 300 using a direct control of the process chambers 314A, 314B, 314C, and 314D or alternatively, by controlling the computers (or controllers) associated with the process chambers 314A, 314B, 314C, and 314D and the tool 300. In operation, the system controller 302 enables data collection and feedback from the respective chambers and systems to optimize performance of the tool 300. The system controller 302 generally includes a central processing unit (CPU) 330, a memory 334, and a support circuit 332. The CPU 330 may be one of any form of a general purpose computer processor that can be used in an industrial setting. The support circuit 332 is conventionally coupled to the CPU 330 and may comprise a cache, clock circuits, input/output subsystems, power supplies, and the like. Software routines, such as processing methods as described above may be stored in the memory 334 and, when executed by the CPU 330, transform the CPU 330 into a specific purpose computer (system controller 302). The software routines may also be stored and/or executed by a second controller (not shown) that is located remotely from the tool 300.

While the foregoing is directed to embodiments of the present disclosure, other and further embodiments may be devised without departing from the basic scope thereof.

The invention claimed is:

1. A method of processing a substrate disposed within a substrate processing chamber, comprising:
  depositing a tungsten seed layer via a plasma enhanced chemical vapor deposition (PECVD) process atop the substrate and directly onto sidewalls and a bottom of a feature formed in a first surface of a dielectric layer of the substrate;
  exposing the substrate to a plasma formed from a first gas comprising a metal organic tungsten precursor to form a tungsten-containing barrier layer directly onto the tungsten seed layer, wherein a temperature of the processing chamber during plasma enhanced atomic layer deposition (PEALD) formation of the tungsten-containing barrier layer is about 175 to about 225 degrees Celsius; and
  depositing a tungsten fill layer directly onto the tungsten-containing barrier layer to fill the feature to the first surface via a plasma enhanced chemical vapor deposition process.

2. The method of claim 1, wherein the feature has an aspect ratio of depth to width of greater than about 5:1.

3. The method of claim 1, wherein the first gas further comprises a hydrogen-containing gas.

4. The method of claim 3, wherein the hydrogen-containing gas is $H_2$ or $NH_3$.

5. The method of claim 1, wherein the first gas further comprises a carrier gas.

6. The method of claim 5, wherein the carrier gas is argon, helium, or nitrogen.

7. The method of claim 6, wherein a flow rate of the carrier gas is about 300 sccm to about 600 sccm.

8. The method of claim 1, wherein the processing chamber is at a pressure of about 5 Torr to about 20 Torr.

9. The method of claim 1, wherein the metal organic tungsten precursor is one of $W(CO)_6$, $CpW(CO)_2NO$, $EtCpW(CO)_2NO$, $Cp^*W(CO)_3NO$, $Cp_2WH_2$, $C_4H_9CNW(CO)_5$, $(C_5H_{11}CN)W(CO)_5$, $W(C_3H_5)_4$, $W(C_3H_4CH_3)_4$, $W(C_4H_6)_3$, $W(C_4H_6)_2(CO)_2$, or $W(C_4H_6)(CO)_4$.

10. The method of claim 1, wherein the tungsten-containing barrier layer has a thickness of about 15 angstroms to about 40 angstroms.

11. A method of processing a substrate disposed within a substrate processing chamber, comprising:
  depositing a tungsten seed layer via a plasma enhanced chemical vapor deposition (PECVD) process atop the substrate and directly onto sidewalls and a bottom of a feature formed in a first surface of a dielectric layer of the substrate;
  depositing a tungsten-containing barrier layer directly onto the tungsten seed layer by exposing the substrate to a plasma formed from a first gas comprising a metal organic tungsten precursor, wherein a temperature of the processing chamber during plasma enhanced atomic layer deposition (PEALD) formation of the tungsten-containing barrier layer is about 175 to about 225 degrees Celsius; and
  depositing a tungsten fill layer, via a plasma enhanced chemical vapor deposition process, directly onto the tungsten-containing barrier layer to fill the feature to the first surface.

12. The method of claim 11, wherein the first gas further comprises a hydrogen-containing gas.

13. The method of claim 12, wherein the hydrogen-containing gas is $H_2$ or $NH_3$.

14. The method of claim 11, wherein the first gas further comprises a carrier gas.

15. The method of claim 14, wherein the carrier gas is argon, helium, or nitrogen.

16. The method of claim 15, wherein a flow rate of the carrier gas is about 300 sccm to about 600 sccm.

17. The method of claim 11, wherein the processing chamber is at a pressure of about 5 Torr to about 20 Torr.

18. The method of claim 11, wherein the metal organic tungsten precursor is one of $W(CO)_6$, $CpW(CO)_2NO$, $EtCpW(CO)_2NO$, $Cp^*W(CO)_3NO$, $Cp_2WH_2$, $C_4H_9CNW(CO)_5$, $(C_5H_{11}CN)W(CO)_5$, $W(C_3H_5)_4$, $W(C_3H_4CH_3)_4$, $W(C_4H_6)_3$, $W(C_4H_6)_2(CO)_2$, or $W(C_4H_6)(CO)_4$.

19. The method of claim 11, wherein the tungsten-containing barrier layer has a thickness of about 15 angstroms to about 40 angstroms.

20. A non-transitory computer readable medium having instructions stored thereon that, when executed, cause a method of processing a substrate disposed within a substrate processing chamber to be performed, the method comprising:
  depositing a tungsten seed layer via a plasma enhanced chemical vapor deposition (PECVD) process atop the substrate and directly onto sidewalls and a bottom of a feature formed in a first surface of a dielectric layer of the substrate;
  exposing the substrate to a plasma formed from a first gas comprising a metal organic tungsten precursor to form a tungsten-containing barrier layer directly atop the tungsten seed layer, wherein a temperature of the processing chamber during plasma enhanced atomic layer deposition (PEALD) formation of the tungsten-containing barrier layer is about 175 to about 225 degrees Celsius; and
  depositing a tungsten fill layer directly over the tungsten-containing barrier layer to fill the feature to the first surface via a plasma enhanced chemical vapor deposition process.

\* \* \* \* \*